United States Patent
Shiraishi

[11] Patent Number: 6,033,472
[45] Date of Patent: Mar. 7, 2000

[54] SEMICONDUCTOR SINGLE CRYSTAL MANUFACTURING APPARATUS

[75] Inventor: Yutaka Shiraishi, Annaka, Japan

[73] Assignee: Super Silicon Crystal Research Institute Corp., Gunma, Japan

[21] Appl. No.: 09/037,515

[22] Filed: Mar. 10, 1998

[30] Foreign Application Priority Data

Mar. 28, 1997 [JP] Japan .................................. 9-095247

[51] Int. Cl.$^7$ .................................................. C30B 35/00
[52] U.S. Cl. ........................ 117/218; 117/208; 117/216; 117/911
[58] Field of Search .................... 117/208, 216, 117/218, 911

[56] References Cited

U.S. PATENT DOCUMENTS

| | | | |
|---|---|---|---|
| 4,186,173 | 1/1980 | Jericho et al. ............................. | 117/911 |
| 4,190,630 | 2/1980 | Apilat et al. .............................. | 117/911 |
| 5,126,113 | 6/1992 | Yamagishi et al. ....................... | 117/911 |
| 5,173,270 | 12/1992 | Kida et al. ............................... | 117/911 |
| 5,702,523 | 12/1997 | Schulmann et al. ..................... | 117/208 |
| 5,843,229 | 12/1998 | Kimura et al. ........................... | 117/208 |
| 5,879,448 | 3/1999 | Urano et al. ............................. | 117/208 |
| 5,879,451 | 3/1999 | Mizuishi ................................... | 117/208 |
| 5,882,397 | 3/1999 | Iino et al. ................................. | 117/208 |

FOREIGN PATENT DOCUMENTS

| | | |
|---|---|---|
| 62-288191 | 12/1987 | Japan . |
| 63-252991 | 10/1988 | Japan . |
| 3285893 | 12/1991 | Japan . |
| 3295893 | 12/1991 | Japan . |
| 4321583 | 11/1992 | Japan . |
| 5270968 | 10/1993 | Japan . |
| 5270974 | 10/1993 | Japan . |
| 5270975 | 10/1993 | Japan . |
| 5270976 | 10/1993 | Japan . |
| 7172981 | 7/1995 | Japan . |
| 9-2893 | 1/1997 | Japan . |

*Primary Examiner*—Felisa Hiteshew
*Attorney, Agent, or Firm*—McDermott, Will & Emery

[57] ABSTRACT

The object of the present invention is to achieve reliable and safe pulling operation of a single crystal having large diameter and heavy weight in a chamber with reduced pressure. The semiconductor manufacturing apparatus of the invention comprises a seed crystal lift mechanism for holding a seed crystal and for moving it up and down, and a single crystal gripping mechanism for gripping a constricted portion of a single crystal formed, whereby the apparatus comprises an accommodation container 10a for accommodating at least a driving unit 14 of the seed crystal lift mechanism and at least a driving unit 15 of the single crystal gripping mechanism, and further accommodation container lift mechanisms 3 and 4 for moving the accommodation container up and down. The accommodation container may be designed in heat-insulating structure, or a cooling means for cooling inside the accommodation container may be further provided. It is also arranged in such manner that power cable and cable for control signal 7 of the seed crystal lift mechanism or the single crystal gripping mechanism are wound up in synchronization with operation of a mechanism 4 for winding up a wire 3, which suspends the accommodation container.

9 Claims, 5 Drawing Sheets

SEMICONDUCTOR SINGLE CRYSTAL MANUFACTURING APPARATUS

BACKGROUND OF THE INVENTION

1. Field of the Invention

The present invention relates to a single crystal growing apparatus and a single crystal growing method for manufacturing a dislocation-free single crystal of silicon by the pulling Czochralski method.

2. Description of the Prior Art

In a single crystal manufacturing apparatus based on the pulling Czochralski (CZ) method, fresh argon (Ar) gas is supplied into a highly pressure-proof airtight chamber made of graphite where pressure is reduced to about 10 torr in advance and polycrystal in a quartz crucible arranged in the lower portion of the chamber is melted by heating. Then, a seed crystal is immersed into surface of the melt from above, and by rotating and moving up and down the seed crystal and the quartz crucible, the seed crystal is pulled up. As a result, a single crystal (the so-called ingot) is grown, which comprises an upper cone portion with its upper end protruding, a cylindrical body portion, and a lower cone portion with its lower end protruding, all under the seed crystal.

As a method to grow as described above, Dash method is known. According to this method, in order to eliminate dislocation (i.e. in order to turn to dislocation-free), which occurs in the seed crystal due to thermal shock when the seed crystal is immersed to the surface of the melt, pulling rate is relatively increased after immersing the seed crystal to the surface of the melt so that a neck portion having smaller diameter than the seed crystal, e.g. 3 to 4 mm, is formed, and pulling of the upper cone portion is started.

Further, a single crystal having large diameter and heavy weight (150 to 200 kg or more) cannot be pulled up via the neck portion with small diameter, and a method has been proposed, for example, in JP-B-5-65477. According to this method, a neck portion with small diameter is formed by Dash method, and the pulling rate is then relatively slowed down and a portion with larger diameter is formed. Then, the pulling rate is relatively increased, and a portion with small diameter is formed. Thus, a "spherical constricted portion" is formed, and by gripping this constricted portion with a gripper, the single crystal having large diameter and heavy weight is pulled up. Also, a conventional type apparatus for gripping the constricted portion is proposed, for example, in JP-B-7-103000 and JP-B-7-515.

As other conventional examples, a method for directly gripping a body portion with a "constricted portion" as described above has been proposed, for example, in JP-A-5-270974 or JPA-7-172981. Also, a method to form a "ring-like constricted portion" having a larger diameter than the body portion between the upper cone portion and the body portion instead of the above "spherical constricted portion" and to grip this "ring-like constricted portion" has been proposed in JP-A-63-252991 and JP-A-5-270975.

However, in each of the conventional type gripping members as described above, there are problems in that it is not very practical to use a gripper and a power transmission mechanism to suspend a single crystal having large diameter and heavy weight (e.g. with a body portion of 400 mm in diameter and 400 kg in weight) in a chamber where pressure is reduced to about 10 torr using vacuum pump. If the single crystal is detached from the gripper and is dropped down, dislocation may occur, and the single crystal is not qualified as a product any more. When the quartz crucible is damaged, high temperature melt may react in the worst case with the cooling water inside the crucible shaft, which rotates and moves up and down the quartz crucible, and vapor explosion may occur.

SUMMARY OF THE INVENTION

To solve the above problems, it is an object of the present invention to provide a semiconductor single crystal manufacturing apparatus, by which it is possible to pull a single crystal having large diameter and heavy weight in a chamber with reduced pressure in reliable and safe manner.

To attain the above object, the apparatus according to the present invention comprises at least a driving unit of a seed crystal lift mechanism for holding a seed crystal and for moving it up and down, and at least a driving unit of a single crystal gripping mechanism for gripping a constricted portion of a single crystal formed under the seed crystal, said driving units are accommodated in a container, and the container is moved up and down.

According to the present invention, there is provided a semiconductor single crystal manufacturing apparatus for manufacturing a semiconductor single crystal by pulling CZ method, comprising:

a seed crystal lift mechanism for holding a seed crystal and moving it in vertical direction; and a single crystal gripping mechanism for gripping a constricted portion of a single crystal formed under said seed crystal, whereby there are further provided:

an accommodation container for accommodating at least a driving unit of said seed crystal lift mechanism and at least a driving unit of said single crystal gripping mechanism; and an accommodation container lift mechanism for moving said accommodation container in vertical direction.

BRIEF DESCRIPTION OF THE DRAWINGS

The above-mentioned objects and features will become more readily apparent from the following description of the embodiment taken in conjunction with the accompanying drawings in which.

DESCRIPTION OF THE PREFERRED EMBODIMENTS

Figure 1:
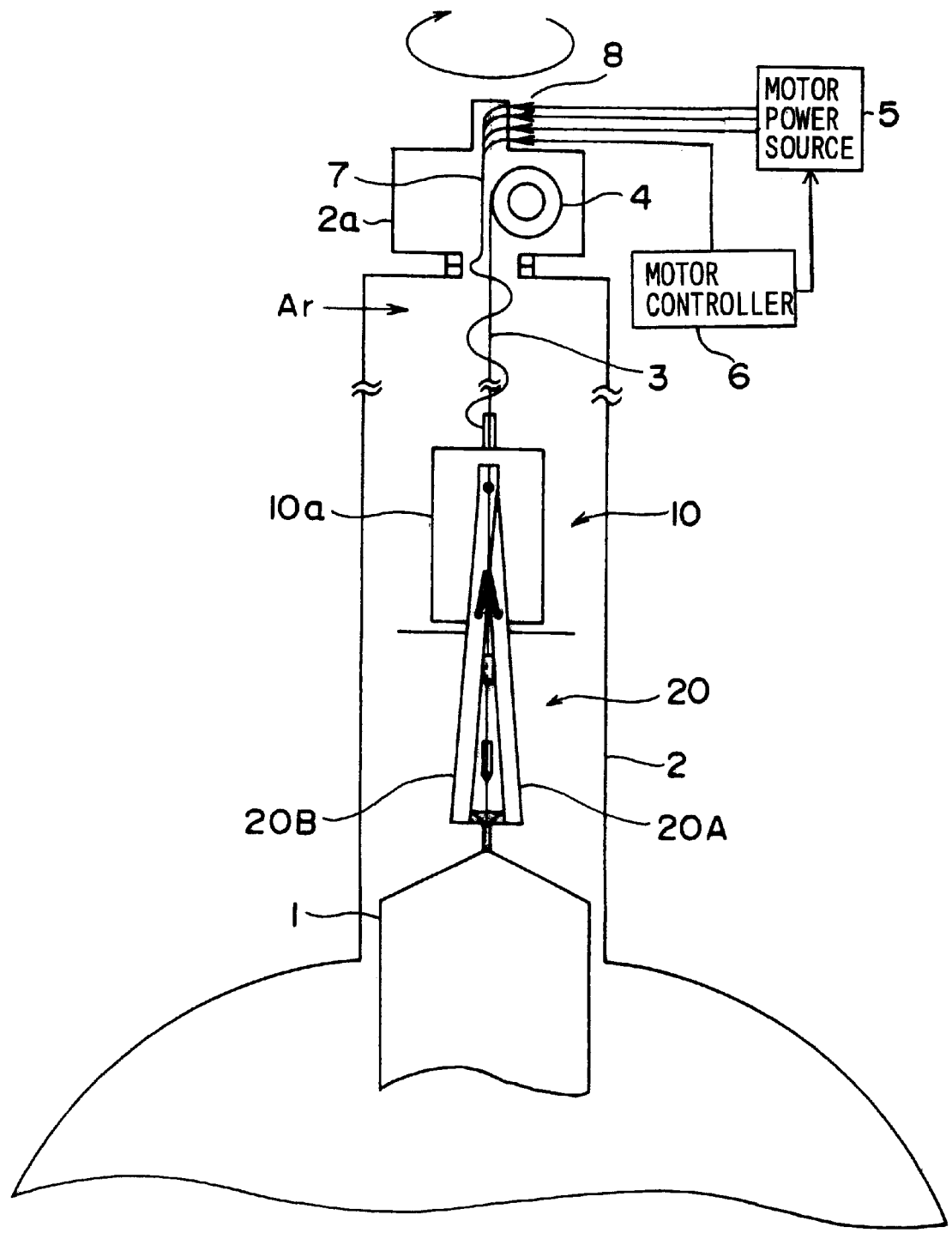
FIG. 1 is a lateral sectional view showing an essential portion of an embodiment of a semiconductor single crystal manufacturing apparatus according to the present invention.
Figure 2:
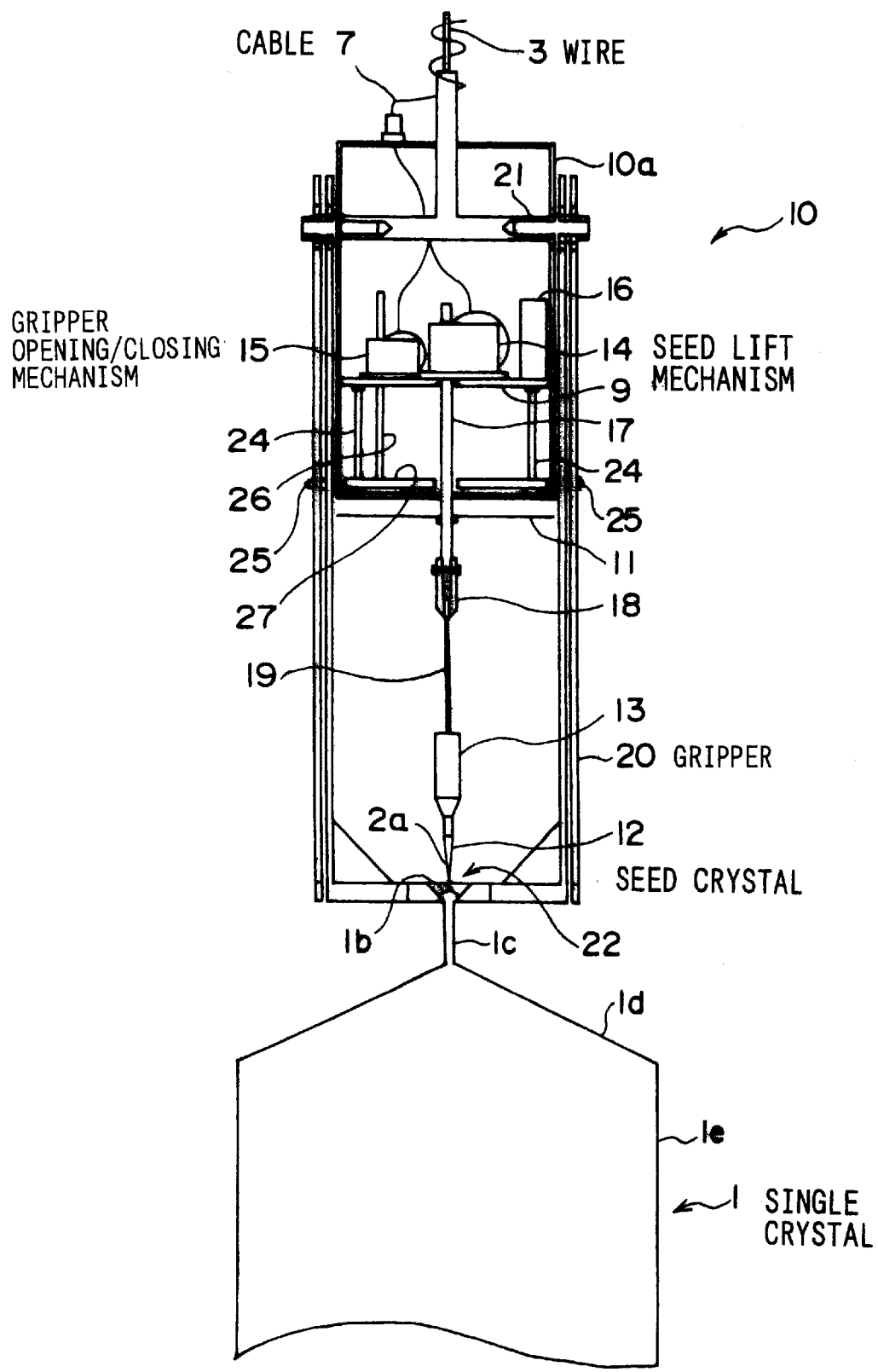
FIG. 2 is an enlarged sectional view showing details of the single crystal holding apparatus of FIG. 1.
Figure 3:
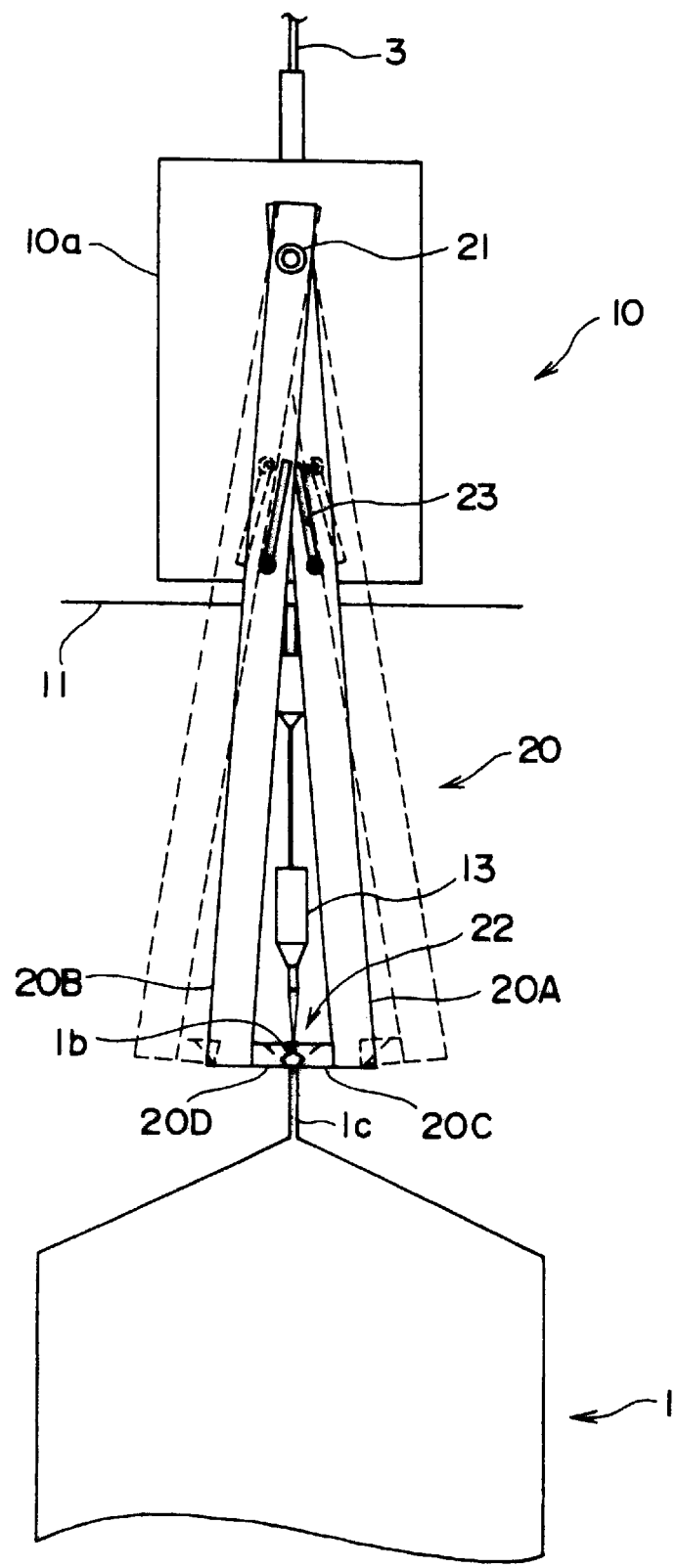
FIG. 3 is a side view of a single crystal holding apparatus of FIG. 2.
Figure 4:
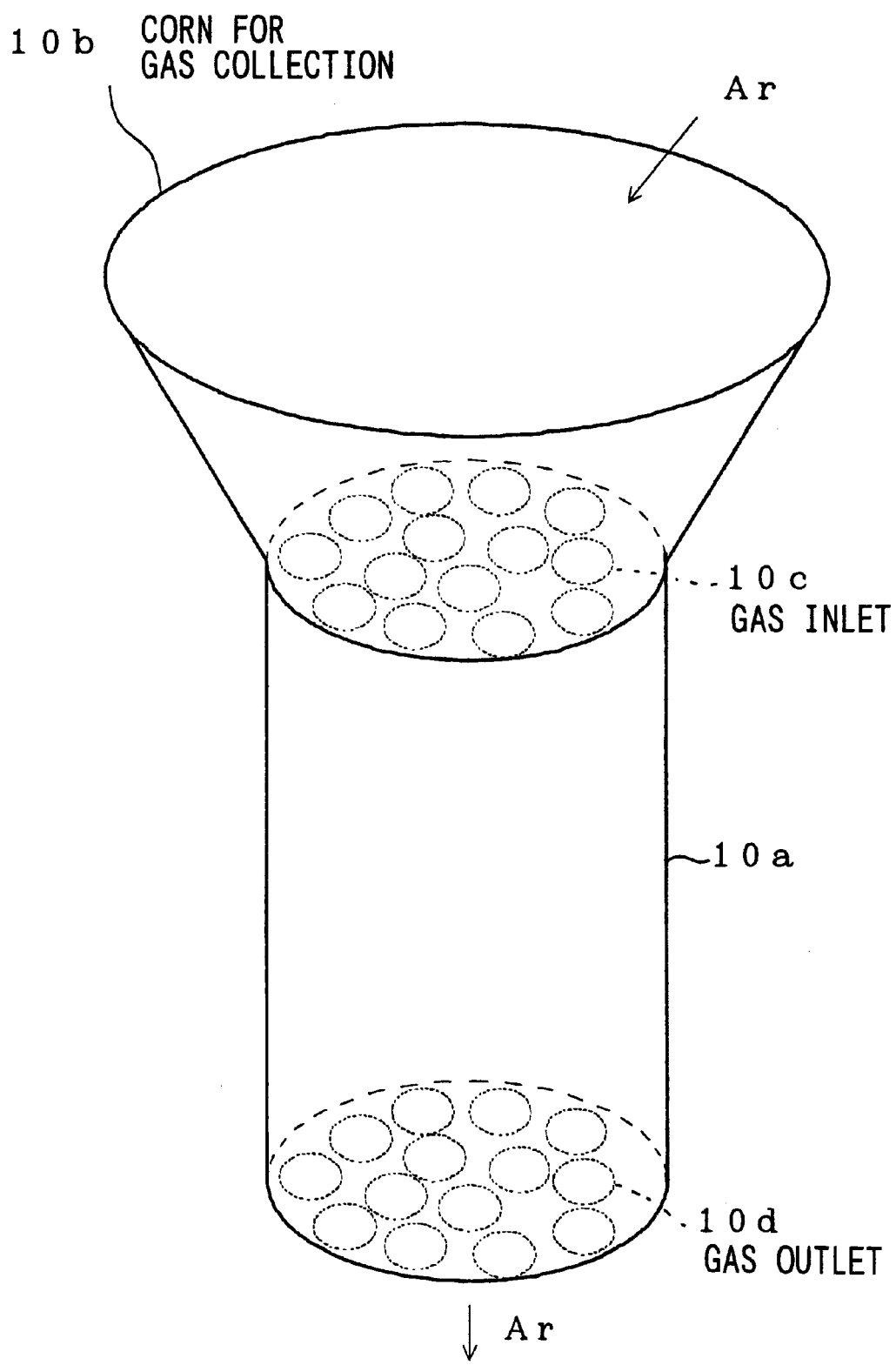
FIG. 4 is an external view of a variation of the single crystal holding apparatus of FIG. 2.

In the following, description will be given on preferred embodiments of the present invention referring to the attached drawings. FIG. 1 is a lateral sectional view showing an essential part of an embodiment of a semiconductor single crystal manufacturing apparatus according to the present invention; FIG. 2 is an enlarged frontal sectional view showing details of the single crystal holding apparatus of FIG. 1; FIG. 3 is a side view of the single crystal holding apparatus of FIG. 2; and FIG. 4 is an external view of a variation of the single crystal holding apparatus of FIG. 2 provided with the function to receive cooling gas.

FIG. 1 is a lateral sectional view schematically showing an essential part of a manufacturing apparatus for pulling a single crystal 1 in a chamber 2. A single crystal holding apparatus 10 is suspended by a wire 3 in the upper portion of the chamber 2, and the wire 3 is wound up on a wire winding drum 4 by operating a wire winding motor (not shown). The wire winding drum 4 and the like are arranged in a drum accommodation unit 2a above the chamber 2. The drum accommodation unit 2a is rotatably mounted with respect to the chamber 2. Therefore, the single crystal holding apparatus 10 is rotated when the drum accommodation unit 2a is rotated, and it is moved up and down by operating the wire 3 and the wire winding drum 4.

From a motor power source 5 and a motor controller 6 provided outside the chamber, power and motor control signals are sent to the single crystal holding apparatus 10 via power and control cables 7 respectively, and the power and control cables 7 are connected to the motor power source 5 and the motor controller 6 via slip rings 8 arranged on the drum accommodation unit 2a so that the cables may not be twisted even when the single crystal holding apparatus 10 is rotated in rotating direction shown by the arrow in FIG. 1. Although not shown in the figure, a quartz crucible, a mechanism to rotate and lift it, and a heater for heating the quartz crucible are arranged under the chamber 2.

Next, detailed description will be given on an arrangement of the single crystal holding apparatus 10 referring to FIG. 2 and FIG. 3. The single crystal holding apparatus 10 comprises a heat-insulation container 10a in cylindrical shape, and a pair of grippers 20 disposed on the lower portion of the heat-insulation container 10a to grip the single crystal 1. A heat shielding plate 11 is mounted on the lower portion of the heat-insulation container 10a. These members and components are made of materials such as graphite, ceramics, molybdenum, carbon, etc.

Also, in order to cool inside the heat-insulation container 10a, it is desirable to arrange cooling fins (not shown) outside the wall of the heat-insulation container 10a, to provide solid cooling elements such as Peltier element inside the heat-insulation container 10a, or to provide a means for guiding the gas outside the heat-insulation container 10a into the heat-insulation container 10a. FIG. 4 shows a variation of the apparatus of the present invention, in which a cone for argon gas collection 10b is mounted on the heat-insulation container 10a, and a gas inlet 10c is formed on the upper end of the heat-insulation container 10a and a gas outlet 10d is formed on the lower end. Also, in order to increase heat-insulation effect of the heat-insulation container 10a, a material with low thermal conductivity, e.g. a ceramic material, may be attached on inner side of the wall of the heat-insulation container 10a.

Inside the heat-insulation container 10a, there are provided a seed lift mechanism 14 for moving up and down a seed crystal holder 13 for holding the seed crystal (seed) 12, a gripper opening and closing mechanism 15 for opening, closing or moving lower ends 20C and 20D of the grippers 20, and a balance weight 16. These are provided on a base plate 9 mounted inside the heat-insulation container 10a, and a guide rail 24 extending downward from the base plate 9 is mounted. Internal structures of the seed lift mechanism 14 and the gripper opening and closing mechanism 15 are not shown in the figure, while each of these mechanisms comprises a seed lifting motor, a gripper opening and closing motor, and a gear mechanism. The seed crystal holder 13 is mounted on the lower end of a connecting shaft 17, and a gear unit provided at the upper end of the connecting shaft 17 is engaged with a gear mechanism in the seed lift mechanism 14. Therefore, when the seed lifting motor in the seed lift mechanism is rotated, the connecting shaft 17 and the seed crystal holder 13 are moved up and down.

The upper ends of a pair of grippers 20 are mounted in such manner that the grippers can be rotated around a shaft 21 arranged at the upper position of the heat-insulation container 10a, and an opening 22 for gripping a constricted portion of the single crystal 1 is provided on the lower ends 20C and 20D of the grippers 20. Also, a slit 23 is formed at the center of the grippers 20. The gear mechanism in the gripper opening and closing mechanism 15 is engaged with the gear unit arranged at the upper end of a rod 26, and a movable plate 27 mounted at the lower end of the rod 26 is moved up and down along the guide rail 24. In FIG. 3, a pair of grippers 20 are opened or closed according to upward or downward movement of the movable plate 27 as to be described later. Solid lines indicate the closed state, and broken lines indicate the opened state.

Figure 5:
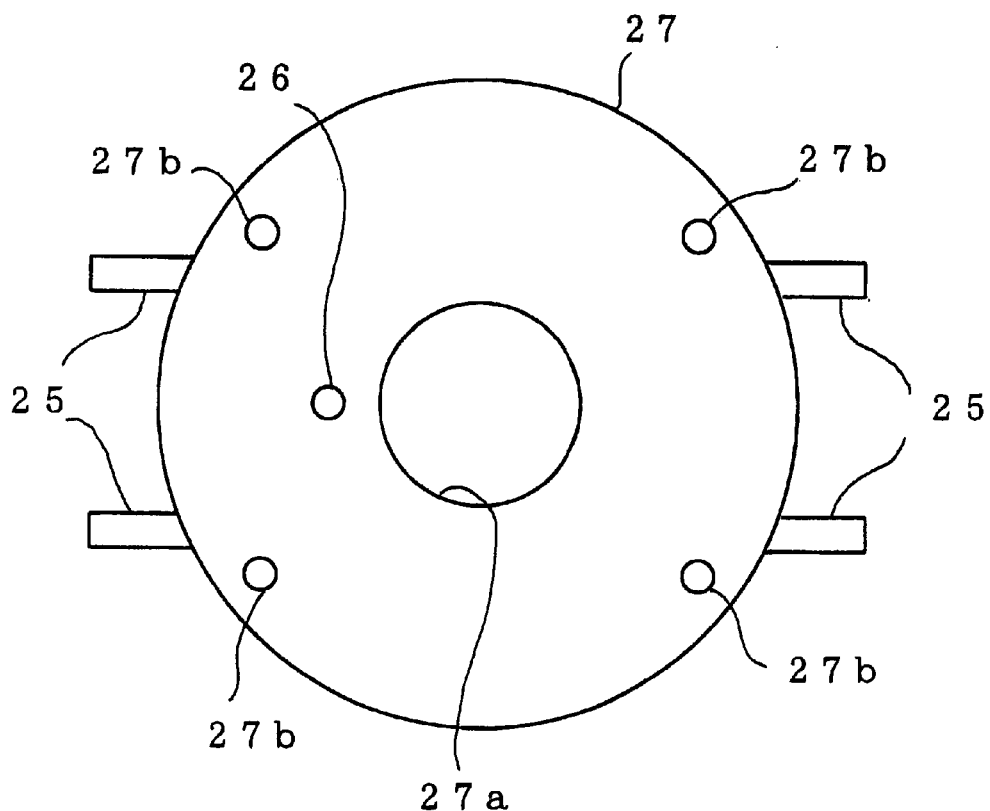
FIG. 5 is a plan view of a movable plate in FIG. 2.

FIG. 5 is a plan view of the movable plate 27. On the movable plate 27, there are provided a center hole 27a for allowing the connecting shaft 17 to pass through, and four holes 27b, through which the guide rails 24 go through. Further, four bosses 25 extending outward are arranged, and these bosses are engaged in four slits 23 of the grippers 20. Therefore, when the gripper opening and closing motor in the gripper opening and closing mechanism 15 is rotated and the rod 26 is moved up, the movable plate 27 is moved up. Then, the bosses 25 are moved up along the slits 23. When the bosses are engaged with the upper ends of the slits 23, the lower ends 20C and 20D of the grippers 20 are opened. On the other hand, when the rod 26 is moved downward, the movable plate 27 is moved down. Then, the bosses are moved down along the slits 23 and are engaged with the lower ends of the slits 23, and the lower ends 20C and 20D of the grippers 20 are closed.

Figure 6:
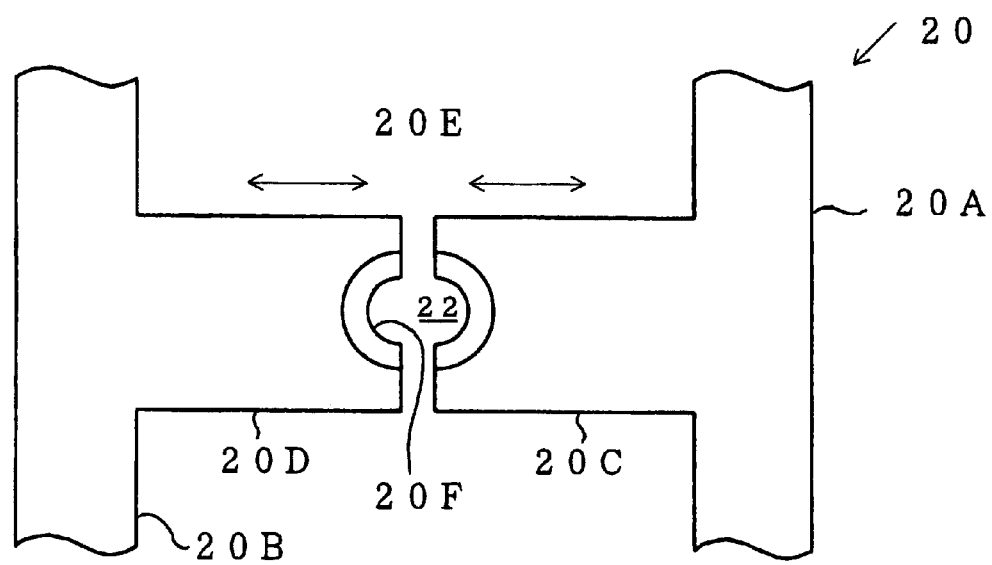
FIG. 6 is a plan view of lower ends of two arms serving as a pair of grippers in FIG. 3.

FIG. 6 is a plan view to explain opening and closing of the lower ends 20C and 20D of the grippers 20. As shown in FIG. 3, a pair of grippers 20 in the present embodiment are designed as two arms 20A and 20B, which are movable in direction substantially perpendicular to the pulling direction of the single crystal. The lower ends 20C and 20D are provided with beveled portions 20E and 20F, which are designed in such manner that these portions become thinner toward the opening 22 in order to hold a portion with larger diameter of the constricted portion of the single crystal from below. These two beveled portions 20E and 20F are designed to form a circular opening 22 when the lower ends 20C and 20D of the two arms 20A and 20B are closed. FIG. 6 shows a situation a little before the condition where the lower ends 20C and 20D of the two arms 20A and 20B are perfectly closed. To give sufficient force to hold the constricted portion, the arms 20A and 20B except the lower ends 20C and 20D are designed to be about 40 mm in width, about 10 mm in thickness, and about 600 mm in length. The lower ends 20C and 20D are 20 to 30 mm in thickness.

When the single crystal 1 is manufactured under the above arrangement, pressure in the chamber 2 is reduced to about 10 torr, and fresh argon gas is supplied. At the same time, a polycrystal in the quartz crucible mounted under the chamber 2 is heated and melted, and the single crystal holding apparatus 10 and the quartz crucible are rotated. The crystal holding apparatus 10 is moved down by operating the wire winding drum 4 with the grippers 20 opened so that the lower ends of the grippers 20 do not come into contact with the surface of the Si melt in the quartz crucible under the chamber 2 and that the seed crystal 12 is immersed in the Si melt, and the seed crystal 12 is moved down by the seed lift mechanism 14. Next, after a predetermined time has elapsed, the seed crystal 12 is pulled up at relatively high rate, and a neck portion 1a with small diameter (3 to 4 mm) is formed under the seed crystal 12. Then, the pulling rate is relatively slowed down, and after a portion with larger diameter has been formed, the pulling rate is relatively increased, and a spherical constricted portion 1b is formed under the neck portion 1a.

Next, a second neck portion 1c having such a diameter as to endure the weight of the single crystal 1 is formed under the constricted portion 1b. By controlling height level of the crystal holding apparatus 10 and the height level of the seed crystal 12, the lower ends of the grippers 20 are closed to grip at a site under the constricted portion 1b. When the grippers 20 grip at the site under the constricted portion 1b, the crystal holding apparatus 10 is moved up. By gradually slowing down the pulling rate, an upper cone portion 1d is formed. Then, by pulling up at a constant rate, a cylindrical body portion 1e is formed. During pulling operation, the quartz crucible is moved in such manner that the surface of the Si melt is always kept at constant level.

There is provided a mechanism for winding up the power cable and/or the cable for control signal for the seed lift mechanism 14 and the single crystal gripper opening and closing mechanism 15 in synchronization. It is preferable to have such an arrangement that the power cable and the cable 7 for control signal are wound up in synchronization with the rotation of the wire winding drum 4 for winding up the wire 3, which suspends the crystal holding apparatus 10.

As described above, according to the present invention, there are provided at least a driving unit of the seed crystal lift mechanism for holding the seed crystal and for moving it up and down and at least a driving unit of the single crystal gripping mechanism for gripping the constricted portion of the single crystal formed under the seed crystal, and these are accommodated in a container, and this container is moved up an down. This makes it possible to pull up a single crystal having large diameter and heavy weight in a chamber with reduced pressure in reliable and safe manner. Also, the container is designed in heat-insulation structure and is provided with cooling function, and this makes it possible to prevent adverse influence to the internal driving units. If it is designed in such manner that power cable and cable for control signal of the seed crystal lift mechanism and the single crystal gripping mechanism are wound up in synchronization with operation of the mechanism for winding up the wire, which suspends the accommodation container, these cables can be well arranged and do not cause trouble or hindrance to operation, and it is very convenient.

What is claimed is:

1. A semiconductor single crystal manufacturing apparatus for manufacturing a semiconductor single crystal by pulling CZ method, comprising:

a seed crystal lift mechanism for holding a seed crystal and moving it in vertical direction; and a single crystal gripping mechanism for gripping a constricted portion of a single crystal formed under said seed crystal;

an accommodation container for accommodating at least a driving unit of said seed crystal lift mechanism and at least a driving unit of said single crystal gripping mechanism;

an accommodation container lift mechanism for moving said accommodation container in vertical direction; and cooling means for cooling an internal space of said accommodation container.

2. A semiconductor single crystal manufacturing apparatus according to claim 1, wherein said accommodation container is designed in heat-resistant construction.

3. A semiconductor single crystal manufacturing apparatus according to claim 1, wherein said single crystal gripping mechanism is positioned under said accommodation container and moved substantially in a direction perpendicular to the pulling direction of said single crystal and opened or closed, and comprises two or more members for gripping a portion with a larger diameter of a constricted portion of the single crystal.

4. A semiconductor single crystal manufacturing apparatus for manufacturing a semiconductor single crystal by pulling CZ method, comprising:

a seed crystal lift mechanism for holding a seed crystal and moving it in vertical direction; and a single crystal gripping mechanism for gripping a constricted portion of a single crystal formed under said seed crystal:

an accommodation container for accommodating at least a driving unit of said seed crystal lift mechanism and at least a driving unit of said single crystal gripping mechanism;

an accommodation container lift mechanism for moving said accommodation container in vertical direction; and cooling means for cooling internal space of said accommodation container, said cooling means including at least one or more of a cooling fin mounted on outside of said accommodation container, a solid cooling element mounted inside said accommodation container, and means for guiding gas present outside the accommodation container into said accommodation container.

5. A semiconductor single crystal manufacturing apparatus for manufacturing a semiconductor single crystal by pulling CZ method, comprising:

a seed crystal lift mechanism for holding a seed crystal and moving it in vertical direction; and a single crystal gripping mechanism for gripping a constricted portion of a single crystal formed under said seed crystal, whereby there are further provided:

an accommodation container for accommodating at least a driving unit of said seed crystal lift mechanism and at least a driving unit of said single crystal gripping mechanism; and an accommodation container lift mechanism for moving said accommodation container in vertical direction, wherein said single crystal gripping mechanism includes a plurality of arms rotating around a certain point of said accommodation container and a member movable along a slit disposed on said arms.

6. A semiconductor single crystal manufacturing apparatus for manufacturing a semiconductor single crystal by pulling CZ method, comprising:

a seed crystal lift mechanism for holding a seed crystal and moving it in vertical direction; and a single crystal gripping mechanism for gripping a constricted portion of a single crystal formed under said seed crystal, whereby there are further provided:

an accommodation container for accommodating at least a driving unit of said seed crystal lift mechanism and at least a driving unit of said single crystal gripping mechanism;

an accommodation container lift mechanism for moving said accommodation container in vertical direction, said accommodation container lift mechanism including a mechanism for winding up wire to suspend said accommodation container; and a synchronous winding mechanism for winding up a power cable for driving said seed crystal lift mechanism in synchronization with operation of said wire winding mechanism.

7. A semiconductor single crystal manufacturing apparatus for manufacturing a semiconductor single crystal by pulling CZ method, comprising:

a seed crystal lift mechanism for holding a seed crystal and moving it in vertical direction; and a single crystal gripping mechanism for gripping a constricted portion of a single crystal lift mechanism and at least a driving unit of said single crystal gripping mechanism;

an accommodation container lift mechanism for moving said accommodation container in vertical direction, said accommodation container lift mechanism including a mechanism for winding up wire to suspend said accommodation container; and a synchronous winding mechanism for winding up a power cable for driving said single crystal gripping mechanism in synchronization with operation of said wire winding mechanism.

8. A semiconductor single crystal manufacturing apparatus for manufacturing a semiconductor single crystal by pulling CZ method, comprising:

a seed crystal lift mechanism for holding a seed crystal and moving it in a vertical direction;

a single crystal gripping mechanism for gripping a constricted portion of a single crystal formed under said seed crystal;

an accommodation container for accommodating at least a driving unit of said seed crystal lift mechanism and at least a driving unit of said single crystal gripping mechanism;

an accommodation container lift mechanism for moving said accommodation container in vertical direction, said accommodation container lift mechanism including a mechanism for winding up wire to suspend said accommodation container; and a synchronous winding mechanism for winding up a cable for a control signal of said seed crystal lift mechanism in synchronization with operation of said wire winding mechanism.

9. A semiconductor single crystal manufacturing apparatus for manufacturing a semiconductor single crystal by pulling CZ method, comprising:

a seed crystal lift mechanism for holding a seed crystal and moving it in vertical direction;

a single crystal gripping mechanism for gripping a constricted portion of a single crystal formed under said seed crystal;

an accommodation container for accommodating at least a driving unit of said seed crystal lift mechanism and at least a driving unit of said single crystal gripping mechanism;

an accommodation container lift mechanism for moving said accommodation container in vertical direction, said accommodation container lift mechanism including a mechanism for winding up wire to suspend said accommodation container; and a synchronous winding mechanism for winding up a cable for a control signal of said single crystal gripping mechanism in synchronization with operation of said wire winding mechanism.

* * * * *